(12) United States Patent
Hamilton et al.

(10) Patent No.: US 9,696,769 B1
(45) Date of Patent: Jul. 4, 2017

(54) COMPUTE CHASSIS HAVING A LID THAT SECURES AND REMOVES AIR BAFFLES

(71) Applicant: Lenovo Enterprise Solutions (Singapore) Pte. Ltd., Singapore (SG)

(72) Inventors: Jeffrey R. Hamilton, Pittsboro, NC (US); Mark J. Staley, Apex, NC (US); Jimmy X. Tang, Raleigh, NC (US); Troy S. Voytko, Apex, NC (US); Jack P. Wong, Apex, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/985,840

(22) Filed: Dec. 31, 2015

(51) Int. Cl.
*G06F 1/18* (2006.01)
*H05K 5/02* (2006.01)
*H05K 7/20* (2006.01)
*F16B 1/00* (2006.01)

(52) U.S. Cl.
CPC ............... *G06F 1/181* (2013.01); *F16B 1/00* (2013.01); *H05K 5/0221* (2013.01); *H05K 5/0239* (2013.01); *H05K 7/20127* (2013.01); *F16B 2001/0035* (2013.01)

(58) Field of Classification Search
CPC .. G06F 1/20; G06F 1/181; G06F 1/18; H05K 7/20727; H05K 7/20; H05K 5/0221; H05K 5/0239; H05K 5/02
See application file for complete search history.

(56) References Cited

U.S. PATENT DOCUMENTS

| | | | | |
|---|---|---|---|---|
| 5,375,038 A | * | 12/1994 | Hardt | G06F 1/20 361/688 |
| 5,432,674 A | * | 7/1995 | Hardt | G06F 1/20 361/688 |
| 6,155,920 A | * | 12/2000 | Pan | G06F 1/20 361/695 |
| 6,370,023 B1 | * | 4/2002 | Su | G06F 1/20 165/80.3 |
| 6,556,438 B1 | * | 4/2003 | Bolognia | H05K 7/20727 361/679.48 |
| 6,711,009 B2 | * | 3/2004 | Lee | G06F 1/181 248/551 |
| 6,711,859 B2 | * | 3/2004 | Bell | B65D 11/00 220/4.02 |
| 6,866,577 B2 | * | 3/2005 | Gough | H05K 7/20172 361/695 |

(Continued)

*Primary Examiner* — Leslie A Nicholson, III
*Assistant Examiner* — Kimberly S Wright
(74) *Attorney, Agent, or Firm* — Jeffery L. Streets

(57) ABSTRACT

A chassis includes a base, a lid, and air baffles disposed within the base. The lid slidably engages opposing base side walls and slides between secured and unsecured positions. In one embodiment, a mechanical latch attaches to the lid and has a spring-biased latch arm for selectively locking the lid to the base and a latch hook for selectively locking the air baffle to the lid, wherein depressing the mechanical latch releases the lid from the base and physically separating the lid from the base causes the latch hook to secure the air baffle for removing the air baffle along with the lid. In another embodiment, a first magnet is attached to the lid and a second magnet is attached to the air baffle, wherein sliding the lid to the unsecured position aligns the first and second magnets and magnetically couples the air baffle to the lid.

12 Claims, 8 Drawing Sheets

(56) References Cited

U.S. PATENT DOCUMENTS

| | | | | |
|---|---|---|---|---|
| 7,012,804 B2 * | 3/2006 | Yokote | G06F 1/184 | 174/15.2 |
| 7,248,476 B2 * | 7/2007 | Holmes | G06F 1/20 | 165/122 |
| 7,256,993 B2 * | 8/2007 | Cravens | G06F 1/20 | 165/104.33 |
| 7,262,964 B1 * | 8/2007 | Barsun | H05K 7/20145 | 165/104.33 |
| 7,432,441 B2 * | 10/2008 | Liang | H05K 7/1411 | 174/17 VA |
| 7,542,289 B2 * | 6/2009 | Tsai | G06F 1/20 | 361/694 |
| 7,643,292 B1 * | 1/2010 | Chen | G06F 1/20 | 361/694 |
| 7,646,601 B2 * | 1/2010 | Zhang | G06F 1/181 | 174/17 R |
| 7,663,875 B2 * | 2/2010 | Lee | G06F 1/20 | 165/104.33 |
| 7,735,669 B2 * | 6/2010 | Liang | G06F 1/181 | 220/4.02 |
| 8,081,444 B2 * | 12/2011 | Xiao | G06F 1/20 | 312/223.2 |
| 8,149,578 B2 * | 4/2012 | Neumann | G06F 1/181 | 361/690 |
| 8,199,501 B2 * | 6/2012 | Sawai | G06F 1/20 | 165/104.33 |
| 8,305,752 B2 * | 11/2012 | Ke | G06F 1/20 | 165/80.2 |
| 8,353,746 B2 * | 1/2013 | Tsai | G06F 1/185 | 454/284 |
| 8,411,437 B2 * | 4/2013 | Shu | H01L 23/467 | 361/695 |
| 8,462,495 B1 * | 6/2013 | Keefe | G11B 33/128 | 312/223.2 |
| 8,464,961 B2 * | 6/2013 | Wu | H05K 7/20181 | 236/49.1 |
| 8,776,833 B2 * | 7/2014 | Zhang | G06F 1/20 | 138/178 |
| 8,780,554 B2 * | 7/2014 | Umematsu | G06F 1/20 | 312/236 |
| 8,875,534 B2 * | 11/2014 | Wu | H05K 7/20181 | 236/49.1 |
| 2002/0001175 A1 * | 1/2002 | Unrein | G06F 1/16 | 361/679.46 |
| 2002/0172020 A1 * | 11/2002 | Trioli | H05K 7/20563 | 361/753 |
| 2005/0083653 A1 * | 4/2005 | Chen | H05K 7/20727 | 361/695 |
| 2005/0231909 A1 * | 10/2005 | Liang | H05K 7/20172 | 361/695 |
| 2007/0047202 A1 * | 3/2007 | Itoh | H05K 7/20172 | 361/695 |
| 2008/0068789 A1 * | 3/2008 | Pav | G06F 1/183 | 361/679.48 |
| 2008/0117589 A1 * | 5/2008 | Carrera | G06F 1/20 | 361/679.51 |
| 2010/0002372 A1 * | 1/2010 | Lee | G06F 1/20 | 361/679.46 |
| 2010/0091456 A1 * | 4/2010 | Chang | G06F 1/181 | 361/679.58 |
| 2010/0165568 A1 * | 7/2010 | Tsai | G06F 1/20 | 361/679.49 |
| 2010/0320883 A1 * | 12/2010 | Yang | G06F 1/181 | 312/223.1 |
| 2011/0069438 A1 * | 3/2011 | Lin | G06F 1/181 | 361/679.5 |
| 2012/0147562 A1 * | 6/2012 | Feng | F28D 15/0266 | 361/696 |
| 2012/0155009 A1 * | 6/2012 | Lai | H05K 7/20727 | 361/679.33 |
| 2012/0155021 A1 * | 6/2012 | Wei | H05K 7/20727 | 361/690 |
| 2013/0050951 A1 * | 2/2013 | Zhou | G06F 1/20 | 361/720 |
| 2013/0163199 A1 * | 6/2013 | Chen | G06F 1/185 | 361/690 |
| 2013/0252532 A1 * | 9/2013 | Wu | H05K 7/20181 | 454/184 |
| 2014/0016268 A1 * | 1/2014 | Tsujimura | H05K 7/20727 | 361/695 |
| 2015/0015130 A1 * | 1/2015 | Lu | H05K 7/1432 | 312/265.5 |

\* cited by examiner

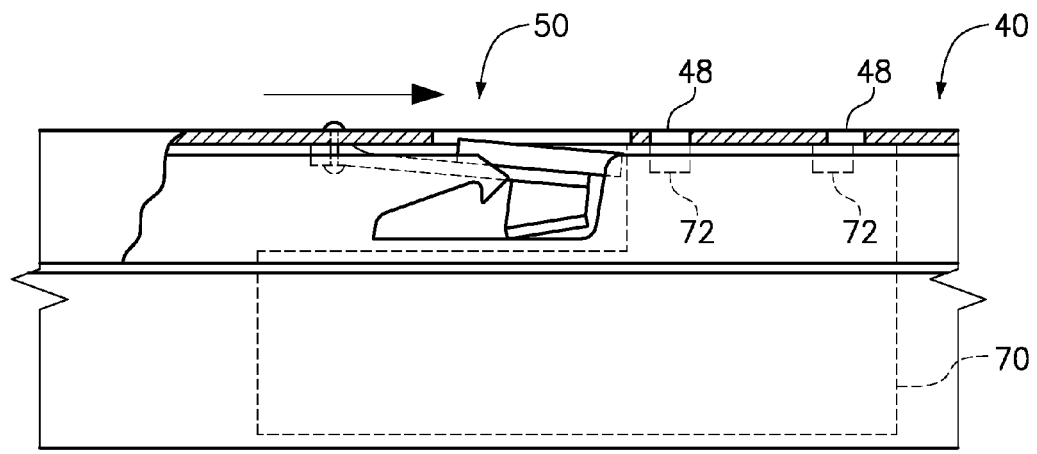
FIG. 6C
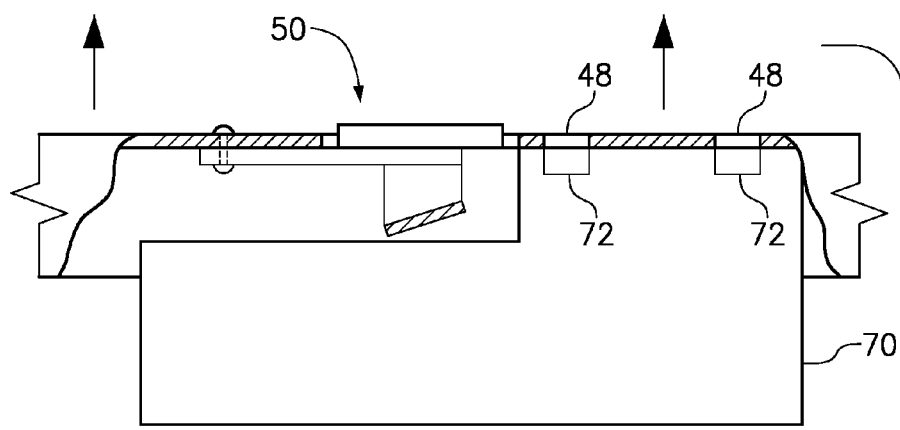
FIG. 6D
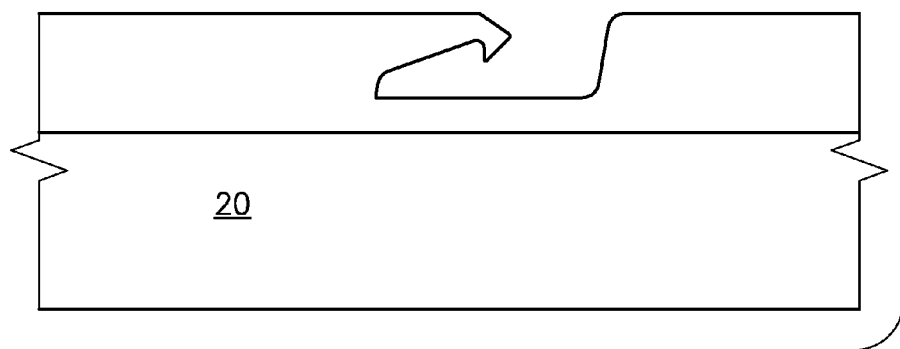

COMPUTE CHASSIS HAVING A LID THAT SECURES AND REMOVES AIR BAFFLES

BACKGROUND

Field of the Invention

The present invention relates to a computer chassis having a removable lid or cover.

Background of the Related Art

A compute node is commonly disposed in a chassis for multiple purposes, including facilitating safe handling of the components, containing electromagnetic interference, and controlling airflow across the components in order to provide adequate cooling. A fan or other air mover may be used to drawn airflow through the chassis, such that cool air is drawn in one end of the chassis and warmed air is exhausted from the opposite end of the chassis.

Since some components within the chassis typically generate more heat than others and the performance of some components can be negatively affected by excessively high temperatures, the flow of cool air to certain components is more critical than the flow of cool air to other components. Providing a desired amount of airflow to a given heat-generating component, such as the processor, may be further affected by the presence or absence of adjacent components that can cause airflow restrictions or diversions. Still further, a component that is directly downstream of a hot component may not be cooled at all by the warmed air passing over that component.

One technique for managing the airflow within a chassis is to provide an air baffle or barrier that redirects the air flow, either around a particular component toward another component. Where a computer system has been specifically designed for use with an air baffle, it is important that the air baffle be in position during operation of the computer system. If the air baffle is removed, lost or positioned improperly, the performance of the computer system can be negatively affected.

BRIEF SUMMARY

One embodiment of the present invention provides a chassis comprising a base, a lid, and air baffles disposed within the base. The base has a bottom wall, a first base side wall and a second base side wall opposite the first base side wall. The lid has a top wall, a first lid side wall and a second lid side wall, wherein the lid is supported by the first and second opposing base side walls with the first lid side wall slidably engaging an outer surface of the first opposing base side wall and the second lid side wall slidably engaging an outer surface of the second base side wall. The chassis further comprises a mechanical latch attached to an inside surface of the top wall of the lid, wherein the mechanical latch is spring biased in a direction away from the base, wherein the mechanical latch includes a latch arm for selectively locking the lid to the base and a latch hook for selectively locking the air baffle to the lid, wherein depressing the mechanical latch releases the lid from the base and wherein physically separating the lid from the base causes the latch hook to secure the air baffle such that the air baffle is removed from the base along with the lid.

Another embodiment of the present invention provides a chassis, comprising: a base, a lid, and air baffles disposed within the base. The base has a bottom wall, a first base side wall and a second base side wall opposite the first base side wall. The lid is supportable by the first and second opposing base side walls, wherein the lid is selectively secured to the base by sliding the lid along the first and second base side walls between a secured position and an unsecured position. The chassis further comprises a first magnet attached to the lid and a second magnet attached to the air baffle, wherein sliding the lid to the unsecured position aligns the first and second magnets and magnetically couples the air baffle to the lid so that separating the lid from the base causes removal of the air baffle from the base along with the lid. Sliding the lid to the secured position offsets the first and second magnets so that the air baffle is not magnetically coupled to the lid.

Yet another embodiment of the present invention provides a method comprising automatically releasably coupling an air baffle to a lid as the lid is being separated from a base, and automatically uncoupling the air baffle from the lid as the lid is being secured to the base.

BRIEF DESCRIPTION OF THE SEVERAL VIEWS OF THE DRAWINGS

FIGS. 6A-6D are partial side views of the chassis as the latch is released from the base and a set of magnets secure the air baffle to the lid before the lid is removed.

DETAILED DESCRIPTION

Figure 1:
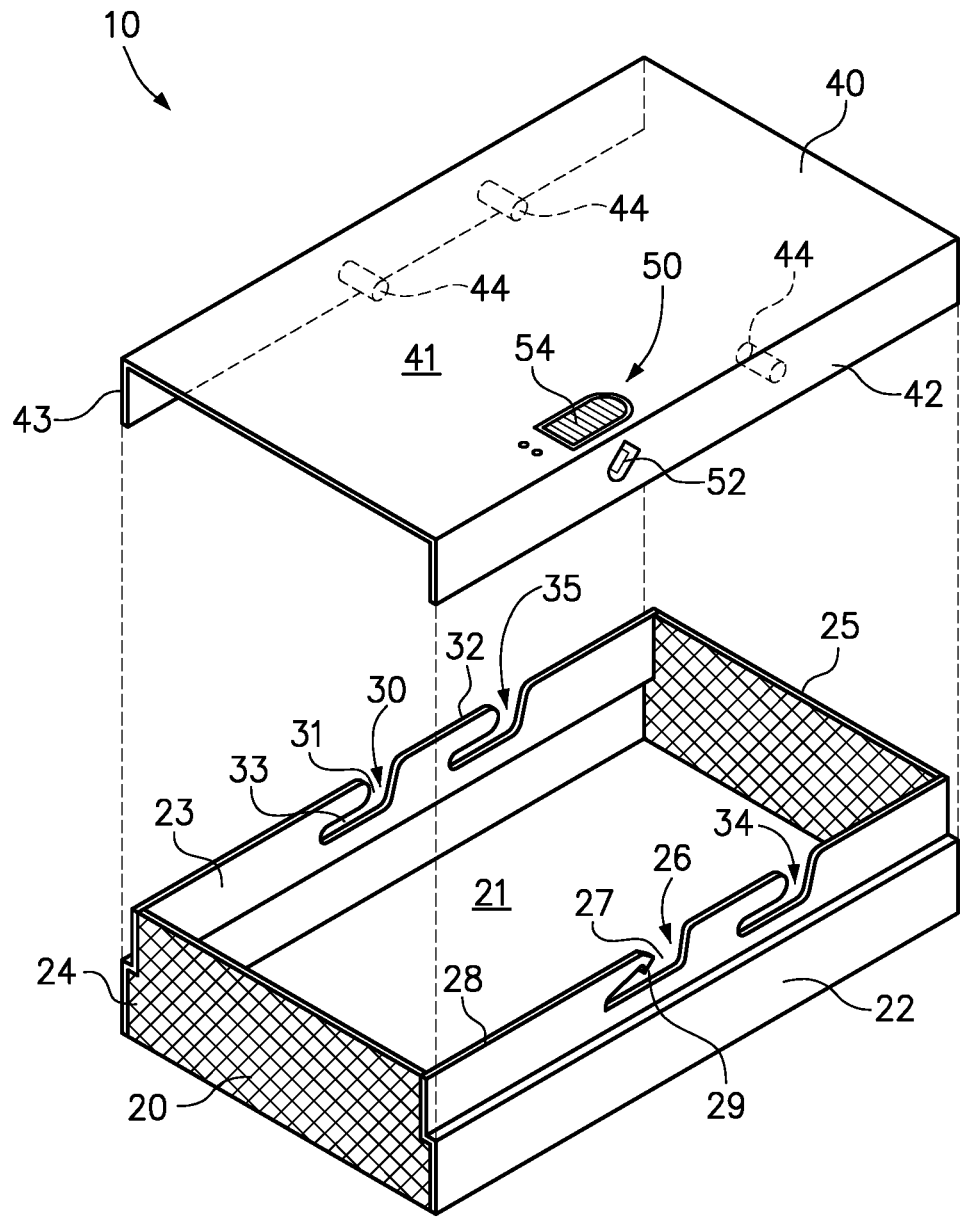
FIG. 1 is a perspective view of a chassis including a base and a securable lid.

One embodiment of the present invention provides a chassis comprising a base, a lid, and air baffles disposed within the base. The base has a bottom wall, a first base side wall and a second base side wall opposite the first base side wall. The lid has a top wall, a first lid side wall and a second lid side wall, wherein the lid is supported by the first and second opposing base side walls with the first lid side wall slidably engaging an outer surface of the first opposing base side wall and the second lid side wall slidably engaging an outer surface of the second base side wall. The chassis further comprises a mechanical latch attached to an inside surface of the top wall of the lid, wherein the mechanical latch is spring biased in a direction away from the base, wherein the mechanical latch includes a latch arm for selectively locking the lid to the base and a latch hook for selectively locking the air baffle to the lid, wherein depressing the mechanical latch releases the lid from the base and wherein physically separating the lid from the base causes the latch hook to secure the air baffle such that the air baffle is removed from the base along with the lid.

The base and the lid form an outer housing of the chassis with the air baffles inside. The chassis will further include one or more heat-generating components, such as a motherboard of a compute node. The air baffles are preferably design to direct airflow relative to the heat-generating components as air is drawn from a front end of the chassis to a back end of the chassis by a fan or other air mover. It is important for the air baffles to be properly positioned so that the heat-generating components are properly cooled. Without the air baffles, one or more of the heat-generating components may overheat or cause the compute node to operate at low performance in order to avoid overheating. Embodiments of the present invention may be used to prevent or reduce loss of the air baffles, yet remove the air baffles from the chassis when the lid is removed for facilitate maintenance of one of the components.

In another embodiment, the chassis further comprises slots in the base side wall and guiding members extending from the lid side walls in order to guide sliding engagement of the lid into position with the base. For example, the chassis may further comprise a first latch slot formed in the first base side wall having a vertical slot portion that extends away from a distal edge of the first base side wall and a second horizontal slot portion that extends in a first direction generally parallel to the bottom wall, and a second latch slot formed in the second base side wall having a vertical slot portion that extends away from a distal edge of the second base side wall and a second horizontal slot portion that extends in a first direction generally parallel to the bottom wall. Still further, the chassis may include a first guide member inwardly directed from the first lid side wall, and a second guide member inwardly directed from the second lid side wall, wherein the first and second guide members are positioned to be received in the latch slots of the first and second base side walls with the first and second lid side walls slidably engaging an outer surface of the first and second based side walls. In one option, sliding the lid in the first direction with the first and second lid side walls slidably engaging an outer surface of the first and second based side walls will cause insertion of the latch arm into the horizontal slot portion of the latch slot of the first base side wall such that the latch arm catches on a hook in the second slot portion to lock the lid in a closed position. In a further option, manually depressing the mechanical latch toward the base both releases the latch arm from the hook and causes the latch hook to align with the air baffle, and wherein sliding the lid in a second direction opposite the first direction with the mechanical latch depressed will cause the hook arm to engage the air baffle. Preferably, the latch hook extends in the second direction and the air baffle includes a mating hook extending in the first direction.

In a preferred implementation, the latch arm has a slanted upper surface that allows the latch arm to slide past the hook without depressing the mechanical latch as the lid is slid in the first direction. This makes it very simple to lock the lid to the base.

In another example, the chassis may further comprise an additional latch slot in each base side wall and an additional guide member inwardly directed from each lid side wall, wherein the additional guide members are positioned to be received in one of the additional latch slots with the first and second lid side walls slidably engaging an outer surface of the first and second based side walls. This may make the lid more secure along the length of the lid or improve alignment of the lid relative to the base. Proper alignment of the lid to the base is particularly important since positioning of the lid for reattachment to the base is also responsible for proper repositioning of the air baffles within the base.

Another embodiment of the present invention provides a chassis, comprising: a base, a lid, and air baffles disposed within the base. The base has a bottom wall, a first base side wall and a second base side wall opposite the first base side wall. The lid is supportable by the first and second opposing base side walls, wherein the lid is selectively secured to the base by sliding the lid along the first and second base side walls between a secured position and an unsecured position. The chassis further comprises a first magnet attached to the lid and a second magnet attached to the air baffle, wherein sliding the lid to the unsecured position aligns the first and second magnets and magnetically couples the air baffle to the lid so that separating the lid from the base causes removal of the air baffle from the base along with the lid. Sliding the lid to the secured position offsets of misaligns the first and second magnets so that the air baffle is not magnetically coupled to the lid.

The chassis may further comprise a mechanical latch for selectively locking the lid to the base in response to sliding the lid to the secured position, wherein depressing the mechanical latch releases the lid from the base so that the lid may be slid to the unsecured position.

Furthermore, the chassis may further comprise a first latch slot formed in the first base side wall having a vertical slot portion that extends away from a distal edge of the first base side wall and a second horizontal slot portion that extends in a first direction generally parallel to the bottom wall, and a second latch slot formed in the second base side wall having a vertical slot portion that extends away from a distal edge of the second base side wall and a second horizontal slot portion that extends in a first direction generally parallel to the bottom wall. The chassis may further comprise a first guide member inwardly directed from the first lid side wall, and a second guide member inwardly directed from the second lid side wall, wherein the first and second guide members are positioned to be received in the latch slots of the first and second base side walls with the first and second lid side walls slidably engaging an outer surface of the first and second based side walls.

In various embodiments, a plurality of magnets may be attached to the lid and a plurality of magnets may be attached to the air baffle, wherein sliding the lid to the unsecured position aligns the plurality of magnets attached to the lid with the plurality of magnets attached to the air baffle. Conversely, sliding the lid to the secured position offsets the plurality of magnets attached to the lid from the plurality of magnets attached to the air baffle so that the air baffle is not magnetically coupled to the lid.

Yet another embodiment of the present invention provides a method comprising automatically coupling an air baffle to a lid as the lid is being separated from a base, and automatically uncoupling the air baffle from the lid as the lid is being secured to the base. In one option, the method may further comprise automatically repositioning the air baffle within the base as the lid engages the base.

Furthermore, the method may further comprise sliding the lid relative to the base between a secured position and an unsecured position. In another option, the method may further comprise mechanically latching the lid to the base in the secured position. More specifically, automatically coupling the air baffle to the lid as the lid is being separated from a base, may include aligning a magnet attached to the lid with a magnet attached to the air baffle as the lid is slid from the secured position to the unsecured position.

FIG. 1 is a perspective view of a chassis 10 including a base 20 and a securable lid 40. The base 20 has a bottom wall 21, a first base side wall 22 and a second base side wall 23 opposite the first base side wall. Typically, the ends 24, 25 will include a screen or mesh with openings to allow air to flow through the chassis. A first latch slot 26 is formed in the first base side wall 22 having a vertical slot portion 27 that extends away from a distal edge 28 of the first base side wall 22 and a horizontal slot portion 29 that extends in a first direction generally parallel to the bottom wall 21, and a second latch slot 30 formed in the second base side wall 23 having a vertical slot portion 31 that extends away from a distal edge 32 of the second base side wall 23 and a second horizontal slot portion 33 that extends in a first direction generally parallel to the bottom wall 21. The base 20 is shown including an additional latch slot 34 in the first base side wall 22 and an additional latch slot 35 in the second base side wall 23. Furthermore, an upper portion of each base side wall 22, 23 is inset slightly in order to receive lid sidewalls as discussed below.

The lid 40 has a top wall 41, a first lid side wall 42 and a second lid side wall 43. The lid 40 is show separated from the base 20, but dashed lines illustrate where the lid would be positioned when fully secured. The lid 40 may be supported by the first and second opposing base side walls 22, 23 with the first lid side 42 wall slidably engaging an outer surface of the first opposing base side wall 22 and the second lid side wall 43 slidably engaging an outer surface of the second base side wall 23. Furthermore, the first and second lid side walls 42, 43 include passive guiding members 44 extending from the lid side walls in order to guide sliding engagement of the lid 40 into a secured position with the base 20.

The chassis 10 further comprises a mechanical latch 50 attached to an inside surface (not shown) of the top wall 41 of the lid 40. The mechanical latch 50 includes a latch arm 52 for selectively locking the lid 40 to the base 20. Depressing the button 54 accessible though the top wall 41 of the lid 40, the mechanical latch 50 unlocks the lid 40 from the base 20. The latch arm 52 is an active guiding member, since it helps to hold the lid 40 down similar to the passive guide members 44 but also locks the lid 40 in closed position. Specifically, the latch arm 52 becomes locked at a distal end of the second horizontal slot portion 29, thereby retaining the latch arm 52 and all of the passive guiding members 44 in the horizontal portion of a corresponding latch slot.

The base 20 and the lid 40 form an outer housing of the chassis 10. The chassis will further include one or more heat-generating components (not shown), such as a motherboard of a compute node, and air baffles (not shown). The air baffles are preferably design to direct airflow relative to the heat-generating components as air is drawn from a front end of the chassis to a back end of the chassis by a fan or other air mover (not shown).

Figure 2A:
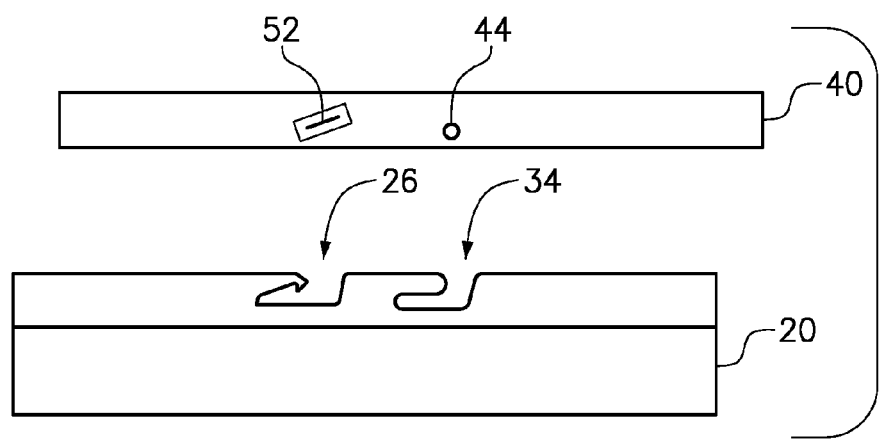
FIGS. 2A-2C are side views of the chassis as the lid is secured to the base.
Figure 2B:
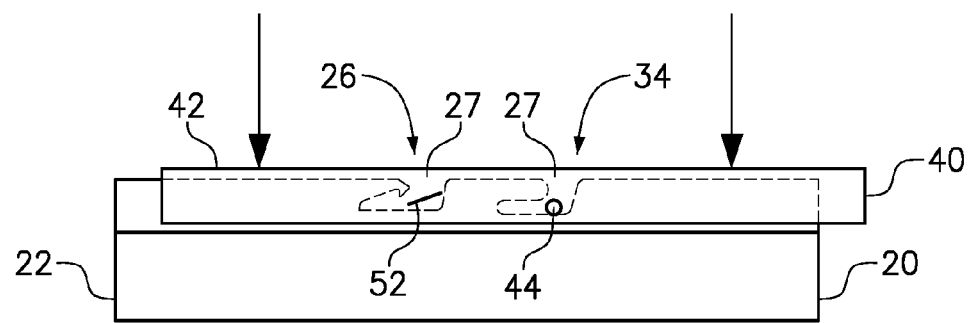
Figure 2C:
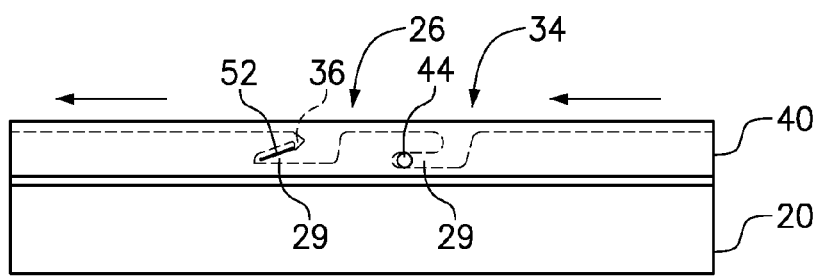

FIGS. 2A-2C are side views of the chassis 10 as the lid 40 is secured to the base 20. In FIG. 2A, the lid 40 is held above the base 20 with the latch arm 52 aligned with the latch slot 26 and the guiding member 44 aligned with the latch slot 34. Note that the lid 40 is somewhat offset to the right end of the base 20, but will not remain offset when the lid 40 has been fully secured.

In FIG. 2B, the lid 40 has been lowered to engage the base 20. Specifically, the lid 40 is now supported by the base side walls (only base side wall 22 is shown) with the lid side walls (only lid side wall 42 is shown) in sliding engagement with the base side walls. Furthermore, the latch arm 52 has traversed the vertical slot portion 27 of the latch slot 26 and the guiding member 44 has traversed the vertical slot portion 27 of the latch slot 34.

In FIG. 2C, the lid 40 has been slid to the left such that the lid 40 is no longer offset from the base 20. Accordingly, the latch arm 52 has traversed the horizontal slot portion 29 of the latch slot 26 and the guiding member 44 has traversed the horizontal slot portion 29 of the latch slot 34. The sliding of the lid 40 has caused the latch arm 52 has causes a slanted surface of the latch arm 52 to contact a hook 36 and flex downward. Once the latch arm 52 passes the hook 36 (to the left in FIG. 2C), the latch arm 52 springs upward behind the hook 36. In this manner, the lid 40 is locked in a secured position until the latch arm 52 is manually depressed.

FIGS. 3A-3D are diagrams of a mechanical latch 50 attached to the top wall 41 lid 40. As shown in the top view of FIG. 3A, the top wall 41 has an opening 45 that allows the button 54 to be accessible from the top surface of the lid 40. The mechanical latch 50 is attached to the top wall 41 by fasteners 56, although other means of attachment are suitable. An flexible strap 58 forms a spring hinge that allows the button 54 and the latch arm 52 to be depressed, but then biases the button 54 and the latch arm 52 back toward the top wall 41 of the lid 40 (i.e., biased in a direction away from the base). Note that the latch arm 52 extends into an opening 59 in the lid side wall 42.

Figure 3A:
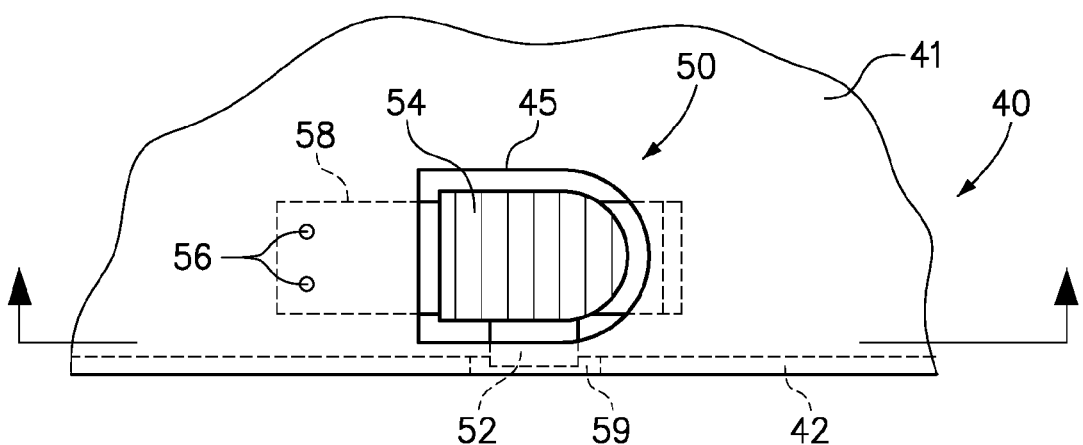
FIGS. 3A-3D are diagrams of a latch attached to the lid.
Figure 3B:
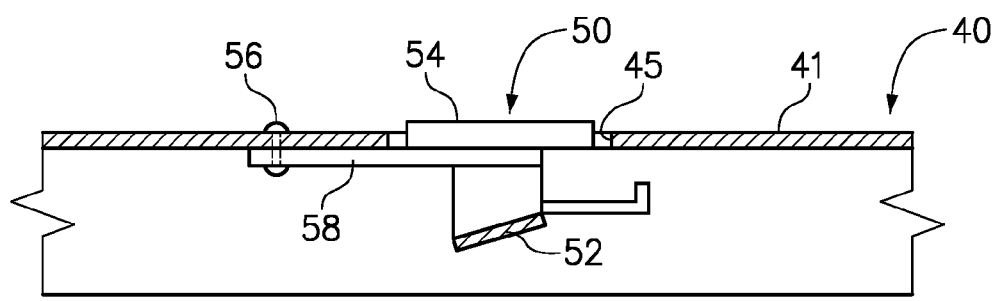

In FIG. 3B, the mechanical latch 50 is shown in a relaxed condition, consistent with FIG. 2A. Accordingly, the button 54 extends into the opening 45 in the lid 40.

Figure 3C:
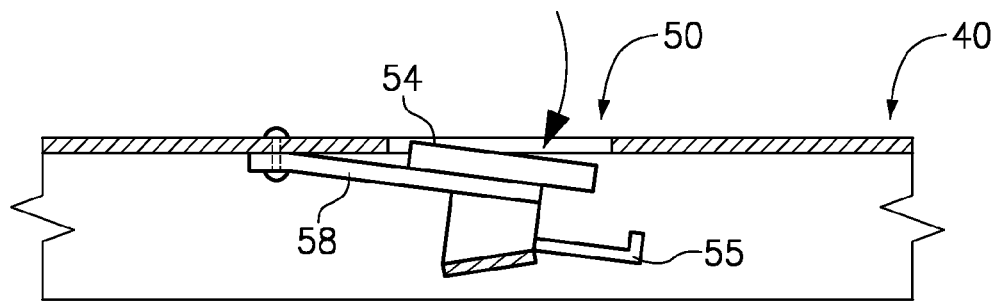

In FIG. 3C, a force (represented by the arrow) may have depressed the button 54 and flexed the strap 58 to bend. A user may manually depress the button 54 to unlock the lid from the base. Note that in this condition, a latch hook 55 is lowered. As shown later, this enables the latch hook to selectively lock or unlock the air baffle to the lid. Alternatively, FIG. 3C may represent the condition of the mechanical latch 50 as the slanted surface 57 slides over the hook (see the hook 36 in FIG. 2C).

Figure 3D:
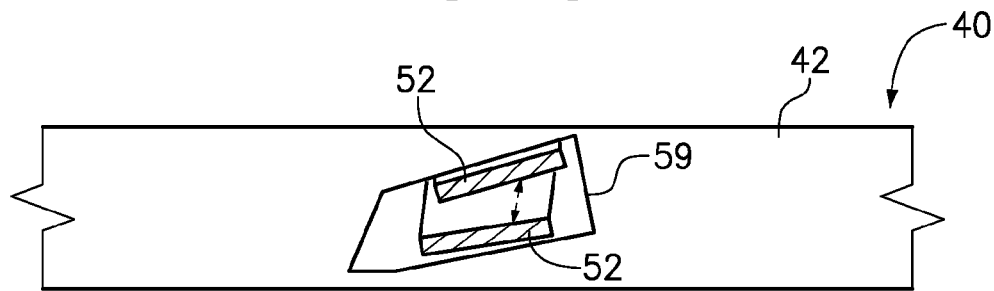

In FIG. 3D, the opening 59 in the lid side wall 42 is shown. Through the opening 59, the latch arm 52 can be seen. For purposes of illustration, the latch arm 52 is shown in an upward position (consistent with FIG. 3B) and a downward position (consistent with FIG. 3C).

Figure 4A:
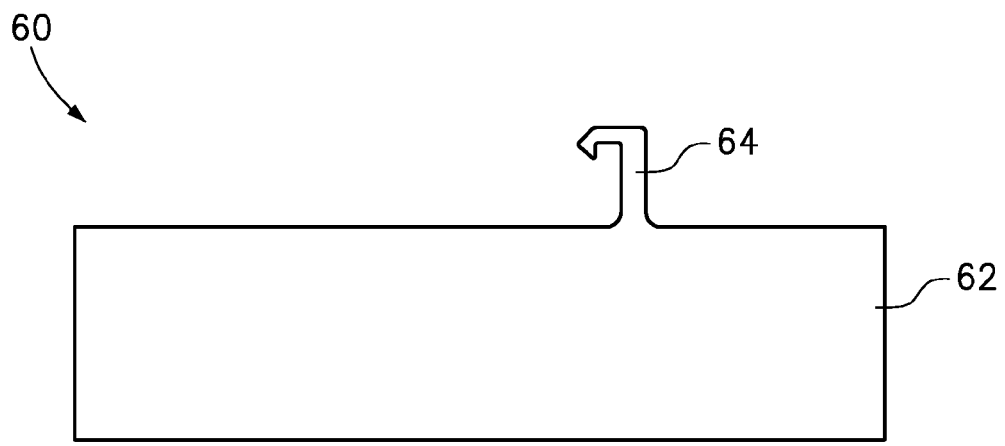
FIGS. 4A-4B are diagrams of an air baffle that may be used to control airflow within the chassis.
Figure 4B:
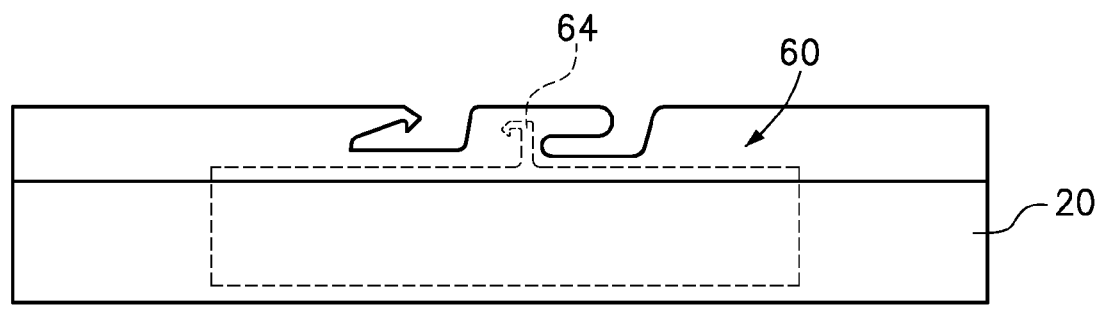

FIGS. 4A-4B are diagrams of an air baffle 60 that may be used to control airflow within the chassis 10. FIG. 4A shows that the air baffle 60 includes a barrier 62 and a hook 64. The barrier may be any shape or size that is needed to manage airflow patterns within the chassis. The hook 64, or similar element such as a loop, should be positioned immediate adjacent the mechanical latch. In FIG. 4B, the air baffle 60 (shown in dashed lines) has been inserted into the chassis base 20.

FIGS. 5A-5D are partial side views of the chassis 10 as the mechanical latch 50 is released from the base and secures the air baffle before the lid is removed. Beginning in FIG. 5A, the lid 40 is locked to the base 20 with the latch arm 52 positioned behind the hook 36. The mechanical latch 50, including the latch arm 52, button 54, latch hook 57, and strap 58, is shown in an upward position consistent with FIG. 3B, although it may be in some position intermediate between an upward position and the depressed position of FIG. 3C. Note that the hook 64 of the air baffle 60 (shown in dashed line) is not coupled to the latch hook 57 in this position.

Figure 5A:
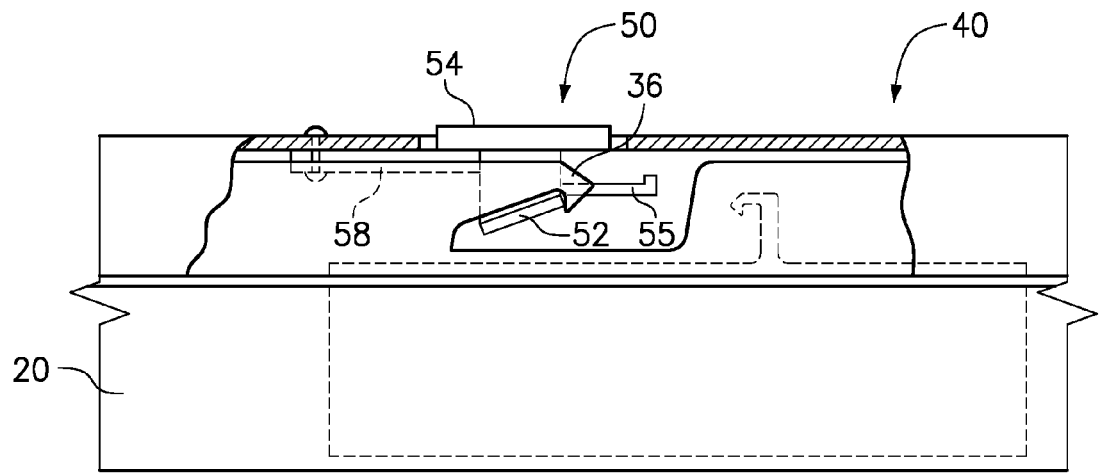
FIGS. 5A-5D are partial side views of the chassis as the latch is released from the base and secures the air baffle before the lid is removed.
Figure 5B:
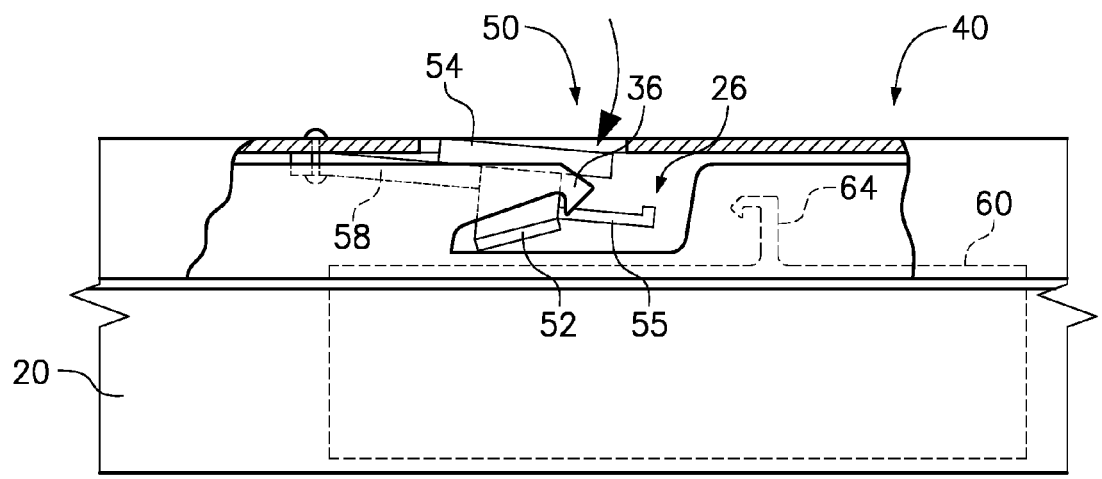

In FIG. 5B, the button 54 has been manually depressed (see arrow) causing the strap 58 to flex downward such that the latch arm 52 no longer engages the hook 36 in the slot 26. With the mechanical latch 50 depressed in the manner shown, the lid 40 is free to slid (to the right as shown in FIG. 5B) such that the latch arm 52 may traverse the horizontal portion of the slot 26. Furthermore, with the mechanical latch depressed, the latch hook 55 is low enough to align with the hook 64 of the air baffle.

Figure 5C:
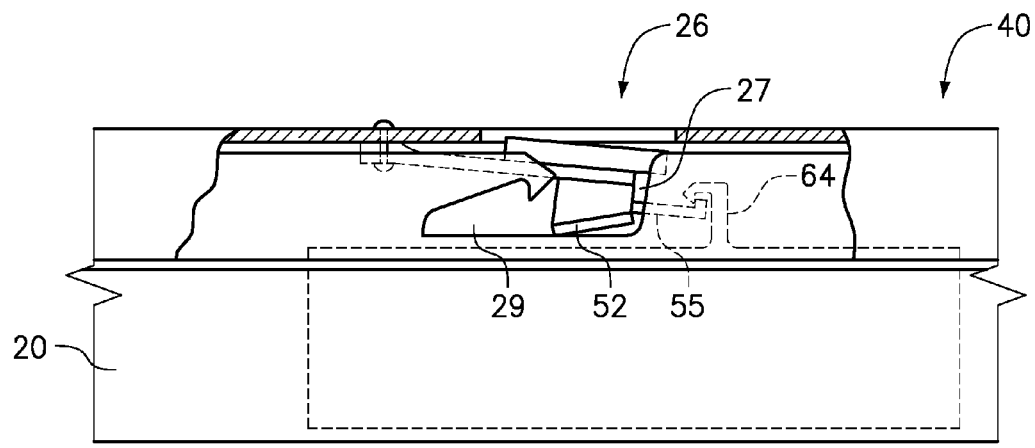
Figure 5D:
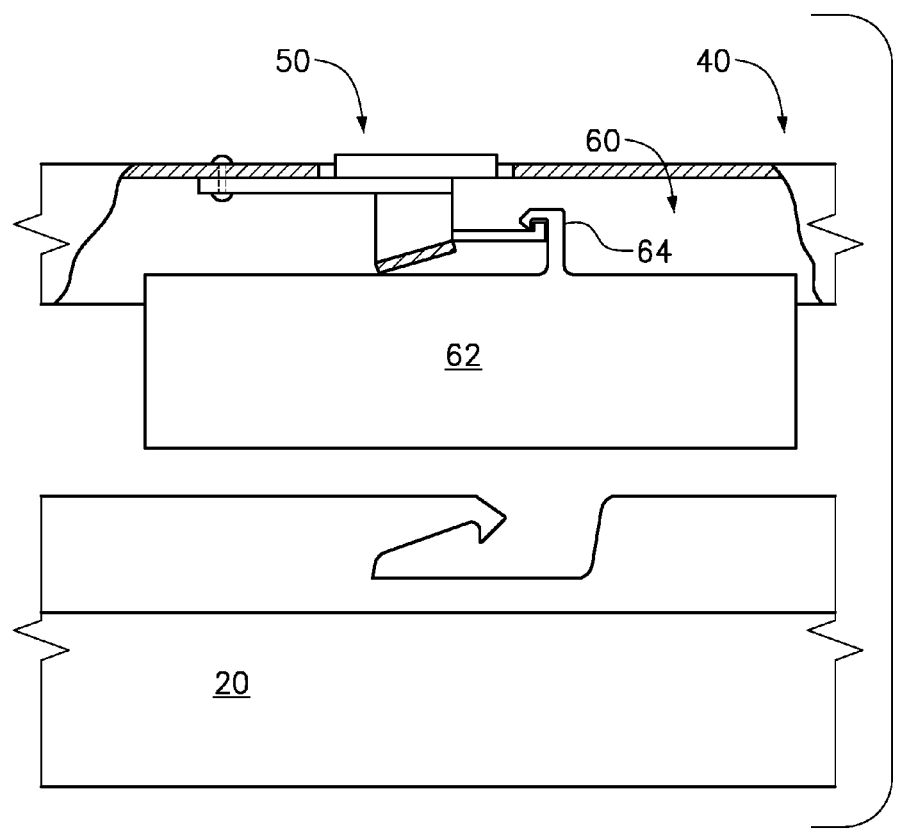

In FIG. 5C, the lid 40 has been slid (to the right) so that the latch arm 52 has traversed the horizontal portion of the slot 26 and is now aligned with the vertical portion 27 of the slot 26. Also, the latch hook 55 has extended under the hook 64 of the air baffle 60. In this position, there is nothing preventing the lid 40 from being lifted off of the base 20. When lifting the lid 40, the latch hook 55 will engage the hook 64 of the air baffle 60 and remove the air baffle 60 along with the lid 40, as is shown in FIG. 5D. It should be appreciated that the reversing the order of FIGS. 5A-5D illustrates how to replace the air baffle 60 within the base 20 and secure the lid 40 to the base 20. Note that while the lid 40 slides relative to the base 20 during latching and unlatching, the air baffle 60 is picked up in an upward vertical motion and will be repositioned in a downward vertical motion, such that the air baffle does not move horizontally among the components within the chassis.

FIGS. 6A-6D are partial side views of another embodiment of the chassis 10 as the mechanical latch 50 is released from the base 20 and a set of magnets secure an air baffle 70 to the lid 40 before the lid is removed. This embodiment is consistent with the embodiment of FIGS. 1-5D, except that the air baffle 70 includes magnets 72 rather than a hook (see hook 64 of the air baffle 60 in FIG. 5B) and the mechanical latch 50 does not have a latch hook (see latch hook 55 in FIG. 5B). Accordingly, the discussion in reference to FIGS. 6A-6D will be focused on the magnetic coupling of the air baffle 70 to the lid 40, rather than the operation of the mechanical latch 50.

Figure 6A:
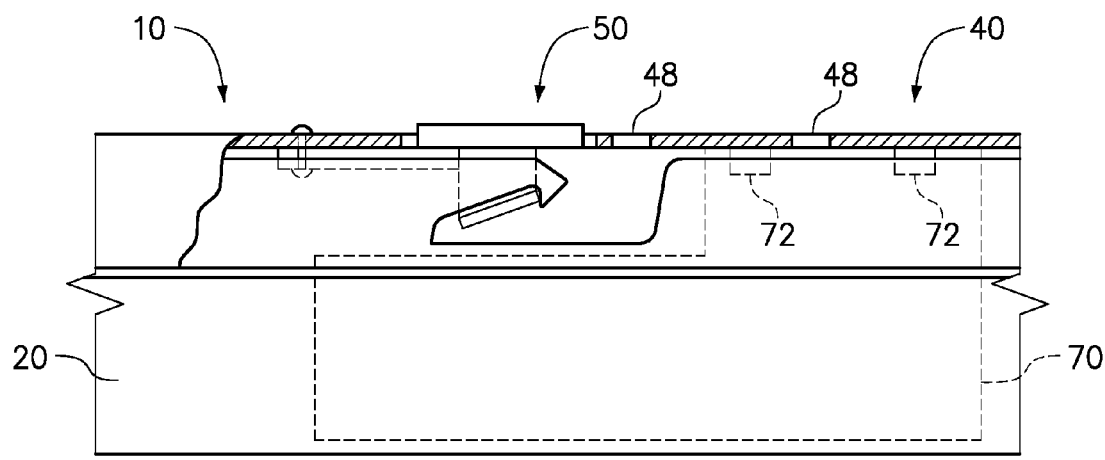

In FIG. 6A, the lid 40 is latched to the base 20 and the magnets 72 attached to the air baffle 70 are misaligned (i.e., not in contact with) magnets 48 attached to the top wall of the lid 40.

Figure 6B:
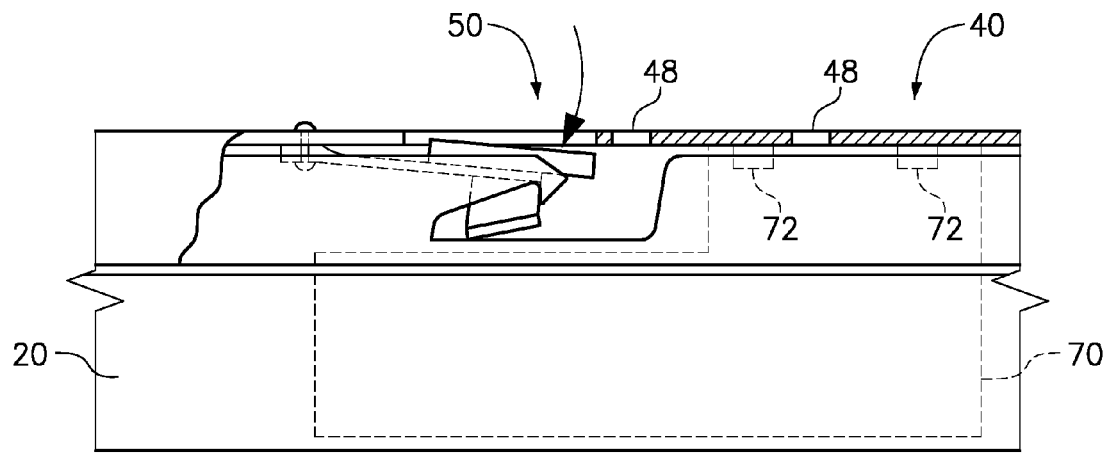

In FIG. 6B, the lid 40 is unlatched from the base 20 by depressing the mechanical latch 50. However, the magnets 72 attached to the air baffle 70 are still misaligned (i.e., not in contact with) magnets 48 attached to the top wall of the lid 40.

In FIG. 6C, the lid 40 has been slid (to the right in FIG. 6C) relative to the base 20 such that the magnets 48 attached to the top wall of the lid 40 are now aligned and magnetically couple with the magnets 72 attached to the air baffle 70. In this position, there is nothing preventing the lid 40 from being lifted off of the base 20. When lifting the lid 40, the air baffle 60 is removed along with the lid 40, as is shown in FIG. 6D.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A chassis, comprising:
   a base having a bottom wall, a first base side wall and a second base side wall opposite the first base side wall;
   a lid having a top wall, a first lid side wall and a second lid side wall, wherein the lid is supported by the first and second opposing base side walls with the first lid side wall slidably engaging an outer surface of the first opposing base side wall and the second lid side wall slidably engaging an outer surface of the second base side wall;
   an air baffle disposed within the base;
   a mechanical latch attached to an inside surface of the top wall of the lid, wherein the mechanical latch is spring biased in a direction away from the base, wherein the mechanical latch includes a latch arm for selectively locking the lid to the base and a latch hook for selectively locking the air baffle to the lid, wherein depressing the mechanical latch releases the lid from the base and wherein physically separating the lid from the base causes the latch hook to secure the air baffle such that the air baffle is removed from the base along with the lid.

2. The chassis of claim 1, further comprising:
   a first latch slot formed in the first base side wall having a vertical slot portion that extends away from a distal edge of the first base side wall and a second horizontal slot portion that extends in a first direction generally parallel to the bottom wall;
   a second latch slot formed in the second base side wall having a vertical slot portion that extends away from a distal edge of the second base side wall and a second horizontal slot portion that extends in a first direction generally parallel to the bottom wall;
   a first guide member inwardly directed from the first lid side wall; and
   a second guide member inwardly directed from the second lid side wall, wherein the first and second guide members are positioned to be received in the latch slots of the first and second base side walls with the first and second lid side walls slidably engaging an outer surface of the first and second based side walls.

3. The chassis of claim 2, wherein sliding the lid in the first direction with the first and second lid side walls slidably engaging an outer surface of the first and second based side walls causes insertion of the latch arm into the horizontal slot portion of the latch slot of the first base side wall such that the latch arm catches on a hook in the second slot portion to lock the lid in a closed position.

4. The chassis of claim 3, wherein manually depressing the mechanical latch toward the base both releases the latch arm from the hook and causes the latch hook to align with the air baffle, and wherein sliding the lid in a second direction opposite the first direction with the mechanical latch depressed causes the hook arm to engage the air baffle.

5. The chassis of claim 4, wherein the latch hook extends in the second direction and the air baffle includes a mating hook extending in the first direction.

6. The chassis of claim 2, wherein the latch arm has a slanted upper surface that allows the latch arm to slide past the hook without depressing the mechanical latch as the lid is slid in the first direction.

7. The chassis of claim 1, further comprising:
   an additional latch slot in each base side wall and an additional guide member inwardly directed from each lid side wall, wherein the additional guide members are positioned to be received in one of the additional latch slots with the first and second lid side walls slidably engaging an outer surface of the first and second based side walls.

8. The chassis of claim 1, wherein positioning the lid for reattachment to the base repositions the air baffles within the base.

9. The chassis of claim 1, wherein a plurality of magnets are attached to the lid and a plurality of magnets are attached to the air baffle, wherein sliding the lid to the unsecured position aligns the plurality of magnets attached to the lid with the plurality of magnets attached to the air baffle, and wherein sliding the lid to the secured position offsets the plurality of magnets attached to the lid from the plurality of magnets attached to the air baffle so that the air baffle is not magnetically coupled to the lid.

10. A chassis, comprising:
a base having a bottom wall, a first base side wall and a second base side wall opposite the first base side wall;
a lid supportable by the first and second opposing base side walls, wherein the lid is selectively secured to the base by sliding the lid along the first and second base side walls between a secured position and an unsecured position;
an air baffle disposed within the base;
a first magnet attached to the lid;
a second magnet attached to the air baffle, wherein sliding the lid to the unsecured position aligns the first and second magnets and magnetically couples the air baffle to the lid so that separating the lid from the base causes removal of the air baffle from the base along with the lid, and wherein sliding the lid to the secured position offsets the first and second magnets so that the air baffle is not magnetically coupled to the lid.

11. The chassis of claim 10, further comprising:
a mechanical latch for selectively locking the lid to the base in response to sliding the lid to the secured position, wherein depressing the mechanical latch releases the lid from the base so that the lid may be slid to the unsecured position.

12. The chassis of claim 10, further comprising:
a first latch slot formed in the first base side wall having a vertical slot portion that extends away from a distal edge of the first base side wall and a second horizontal slot portion that extends in a first direction generally parallel to the bottom wall;
a second latch slot formed in the second base side wall having a vertical slot portion that extends away from a distal edge of the second base side wall and a second horizontal slot portion that extends in a first direction generally parallel to the bottom wall;
a first guide member inwardly directed from the first lid side wall; and
a second guide member inwardly directed from the second lid side wall, wherein the first and second guide members are positioned to be received in the latch slots of the first and second base side walls with the first and second lid side walls slidably engaging an outer surface of the first and second based side walls.

* * * * *